(12) United States Patent
Yamaguchi (10) Patent No.: US 12,306,387 B2
(45) Date of Patent: May 20, 2025

(54) LIGHT SOURCE APPARATUS, LITHOGRAPHY APPARATUS, AND ARTICLE MANUFACTURING

(71) Applicant: CANON KABUSHIKI KAISHA, Tokyo (JP)

(72) Inventor: Takayuki Yamaguchi, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 243 days.

(21) Appl. No.: 18/060,041

(22) Filed: Nov. 30, 2022

(65) Prior Publication Data

US 2023/0176351 A1    Jun. 8, 2023

(30) Foreign Application Priority Data

Dec. 6, 2021  (JP) ................. 2021-197806

(51) Int. Cl.
| | | |
|---|---|---|
| G03F 7/00 | (2006.01) | |
| G02B 19/00 | (2006.01) | |
| G03B 21/20 | (2006.01) | |
| G03B 21/28 | (2006.01) | |

(52) U.S. Cl.
CPC ..... *G02B 19/0028* (2013.01); *G03B 21/2006* (2013.01); *G03B 21/28* (2013.01); *G03F 7/70016* (2013.01); *G03F 7/70175* (2013.01)

(58) Field of Classification Search
CPC .......... G02B 19/0028; G03B 21/2006; G03B 21/28; G03F 7/70016; G03F 7/70175; G03F 7/70858; G03F 7/2008; G03F 7/7015; G03F 7/70891; H01J 61/025; H01J 61/20; H01J 61/36; H01J 61/52
See application file for complete search history.

(56) References Cited

U.S. PATENT DOCUMENTS 8,148,901 B2    4/2012  Morimoto et al.
2016/0266497 A1*  9/2016  Suda ................. G02B 19/0028

FOREIGN PATENT DOCUMENTS

| JP | 2003017003 A | 1/2003 | |
|---|---|---|---|
| JP | 2009104860 A | 5/2009 | |
| JP | 2011187335 A | 9/2011 | |
| KR | 20010055188 A | 7/2001 | |
| KR | 1020070002092 A | 1/2007 | |
| KR | 1020180087200 A | 8/2018 | |
| KR | 20220044673 A * | 4/2022 | ......... G03F 7/70858 |
| TW | 200942980 A | 10/2009 | |

OTHER PUBLICATIONS

Office Action issued in Taiwanese Appln. No. 111141132 dated Feb. 13, 2025.

* cited by examiner

Primary Examiner — Peter B Kim
(74) Attorney, Agent, or Firm — ROSSI, KIMMS & McDOWELL LLP (57) ABSTRACT

A light source apparatus configured to emit light includes a condenser unit configured to reflect light from a light source and to condense the light on a condensing point, a light shielding unit disposed on an optical path of the light from the condenser unit, and a reflector unit disposed between the condenser unit and the light shielding unit and configured to reflect the light from the condenser unit. The reflector unit is disposed so that reflected light is condensed by the condenser unit toward the condensing point.

16 Claims, 9 Drawing Sheets

LIGHT SOURCE APPARATUS, LITHOGRAPHY APPARATUS, AND ARTICLE MANUFACTURING

BACKGROUND

Technical Field

One of the aspects of the disclosure relates to a light source apparatus, lithography apparatus, and article manufacturing method.

Description of the Related Art

An exposure apparatus for use with a lithography process that manufactures a device such as a semiconductor device and a display device includes a light source apparatus having a light source such as a lamp.

Japanese Patent Laid-Open No. ("JP") 2011-187335 discloses a light source apparatus comprising a lamp that includes a base unit, a condenser mirror for condensing light from the lamp, a lead wire connected to the base unit, and a nozzle for ejecting gas for cooling the base unit.

However, in the light source apparatus disclosed in JP 2011-187335, the light from the condenser mirror may be shielded by the lead wire, nozzle, etc., and the illuminance of the light emitted from the light source apparatus may reduce.

SUMMARY

One of the aspects of the disclosure provides a light source apparatus that can suppress illuminance reduction of light.

A light source apparatus according to one aspect of the disclosure is configured to emit light and includes a condenser unit configured to reflect light from a light source and to condense the light on a condensing point, a light shielding unit disposed on an optical path of the light from the condenser unit, and a reflector unit disposed between the condenser unit and the light shielding unit and configured to reflect the light from the condenser unit. The reflector unit is disposed so that reflected light is condensed by the condenser unit toward the condensing point.

A lithography apparatus according to another aspect of the disclosure is configured to form a pattern on a substrate and includes the above light source apparatus. An article manufacturing method according to another aspect of the disclosure includes the steps of forming a pattern on a substrate using the above lithography apparatus, and manufacturing an article from the substrate on which the pattern has been formed.

Further features of the disclosure will become apparent from the following description of exemplary embodiments with reference to the attached drawings.

DESCRIPTION OF THE EMBODIMENTS

Referring now to the accompanying drawings, a detailed description will be given of embodiments according to the disclosure. Corresponding elements in respective figures will be designated by the same reference numerals, and a duplicate description thereof will be omitted.

First Embodiment

Figure 1:
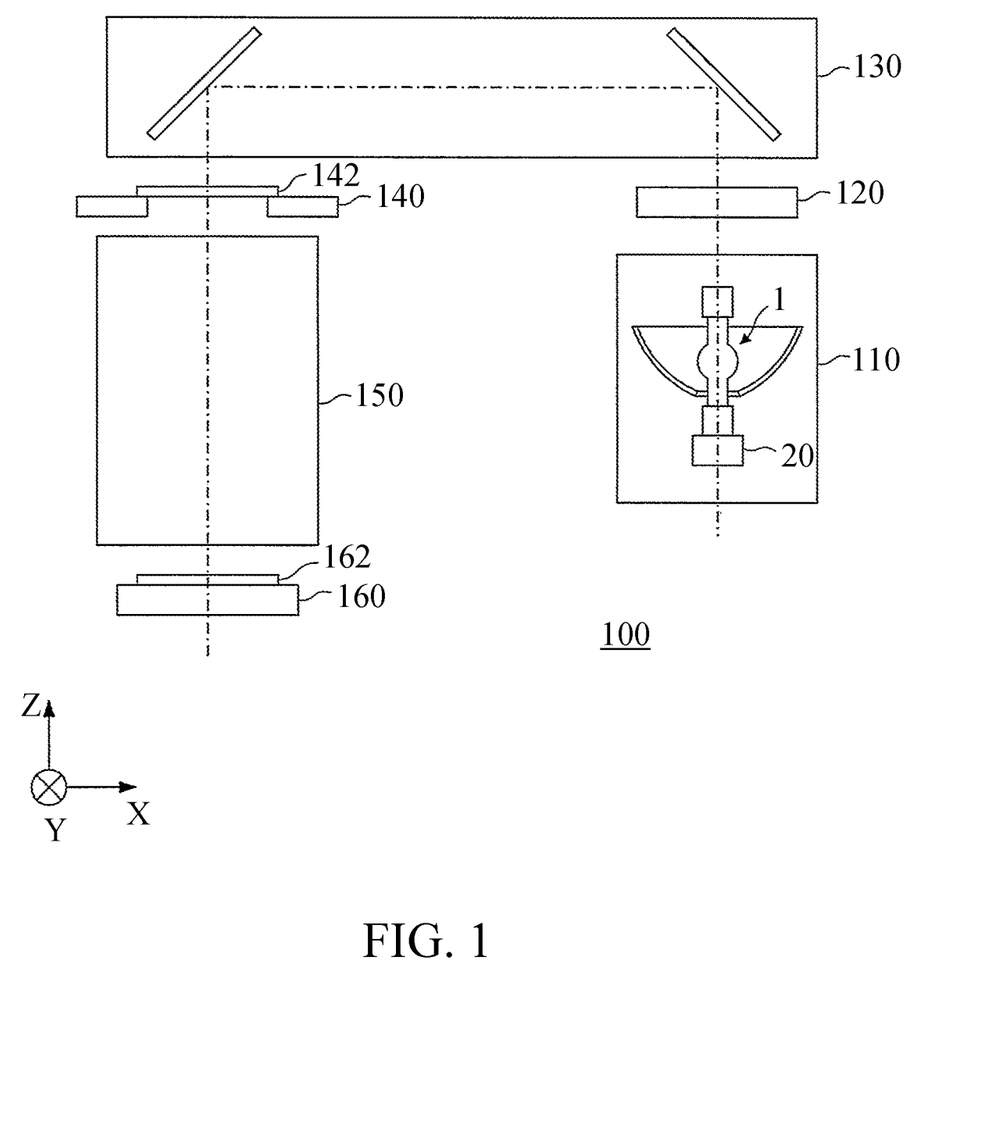
FIG. 1 is a configuration diagram of an exposure apparatus according to a first embodiment.

FIG. 1 is a configuration diagram of an exposure apparatus 100 according to this embodiment. In the example of FIG. 1, a Z-axis direction (vertical direction, up-down direction) is a direction (optical axis direction) along an optical axis O of a condenser mirror 2 described below, and an XY plane (horizontal plane) is a plane orthogonal to the optical axis direction of the condenser mirror 2. The exposure apparatus 100 includes a lamp irradiating apparatus (light source apparatus) 110, a shutter apparatus 120, an illumination optical system 130, an original holding unit 140, a projection optical system 150, and a substrate holding unit 160.

The lamp irradiating apparatus 110 includes a holding unit 20 that holds a lamp (light source) 1. The original holding unit 140 holds an original 142 and is disposed by an unillustrated original positioning mechanism. The substrate holding unit 160 holds a substrate 162 coated with a resist (photosensitive material) by a resist coating apparatus and is disposed by an unillustrated substrate positioning mechanism.

The shutter apparatus 120 is disposed so that it can shield a light beam (luminous flux) in the optical path between the lamp irradiating apparatus 110 and the original holding unit 140. The illumination optical system 130 illuminates the original 142 using light from the lamp irradiating apparatus 110. The projection optical system 150 projects a pattern of the original 142 illuminated by the illumination optical system 130 onto the substrate 162. Thereby, the substrate 162 is exposed and a latent image pattern is formed in the resist applied to the substrate 162. The latent image pattern is developed by an unillustrated developing apparatus. The resist pattern is thereby formed on the substrate 162.

Here, the example of FIG. 1 sets the optical axis direction of the condenser mirror 2 to the Z-axis direction, but it is not limited to this example. For example, the lamp irradiating apparatus 110 may be disposed so that the direction along the optical axis O of the condenser mirror 2 is the X-axis direction and the lamp irradiating apparatus 110 emits light along the X-axis direction to the illumination optical system 130.

Figure 2:
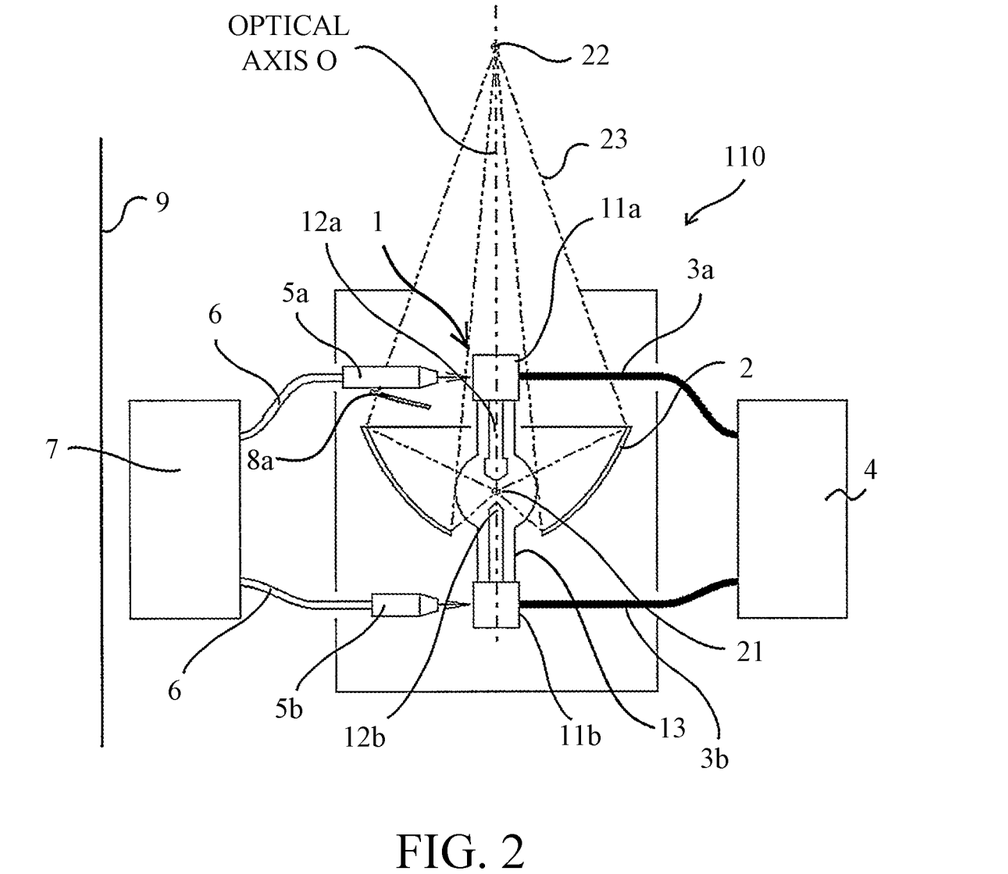
FIG. 2 is a configuration diagram of a lamp irradiating apparatus according to the first embodiment.

FIG. 2 is a configuration diagram of the lamp irradiating apparatus 110 according to this embodiment. The lamp irradiating apparatus 110 includes a lamp 1, a condenser mirror (condenser unit) 2, nozzles 5a and 5b, pipes 6, an air supply apparatus 7, and a reflective element (reflector unit)

8a. The lamp 1 is a mercury lamp in this embodiment, but may be a short arc type lamp such as a xenon lamp and a metal halide lamp. The lamp 1 includes lead wires 3a and 3b, an anode-side base (base unit) 11a, a cathode-side base 11b, an anode 12a, a cathode 12b, and a light emitting tube 13. The anode-side base 11a and the anode 12a, and the cathode-side base 11b and the cathode 12b are respectively connected by unillustrated molybdenum foil. A rare gas such as neon or xenon, mercury, sodium, scandium, or a mixture of these gases is sealed inside the light emitting tube 13. The anode-side base 11a is connected to a lamp power supply 4 by a lead wire 3a. The cathode-side base 11b is connected to the lamp power supply 4 by a lead wire 3b. In a case where electric power is supplied between the anode 12a and the cathode 12b through the lead wires 3a and 3b, arc discharge is generated between the anode 12a and the cathode 12b. Thereby, the lamp 1 emits light. The condenser mirror 2 is, for example, an elliptical mirror having two focal points, and is disposed so that a bright spot of the lamp 1 is disposed near a first focal point 21. The condenser mirror 2 reflects the light from the lamp 1 and condenses it onto a second focal point (condensing point) 22. The lamp 1 is disposed along the optical axis O of the condenser mirror 2, that is, along an axis connecting the first focal point 21 and the second focal point 22. The nozzles 5a and 5b are connected to the air supply apparatus 7 through the pipes 6, and blow high-pressure air supplied from the air supply apparatus 7 to the anode-side base 11a and the cathode-side base 11b, respectively, for cooling them. The nozzle 5a is disposed at a position that shields part of an effective light beam 23 (light from the condenser mirror 2). This embodiment uses air for cooling, but may use another cooling medium (for example, a gas such as nitrogen and helium). The reflective element 8a is disposed between the condenser mirror 2 and the nozzle 5a (light shielding unit).

Figure 3A:
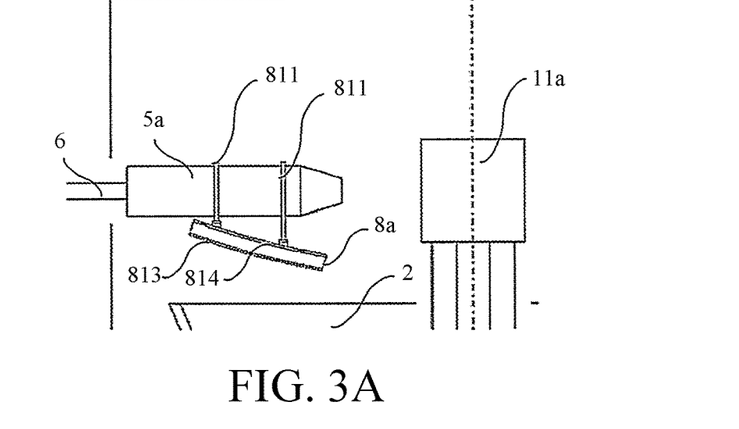
FIGS. 3A to 3C illustrate an arrangement of a nozzle and a reflective element in the first embodiment.
Figure 3B:
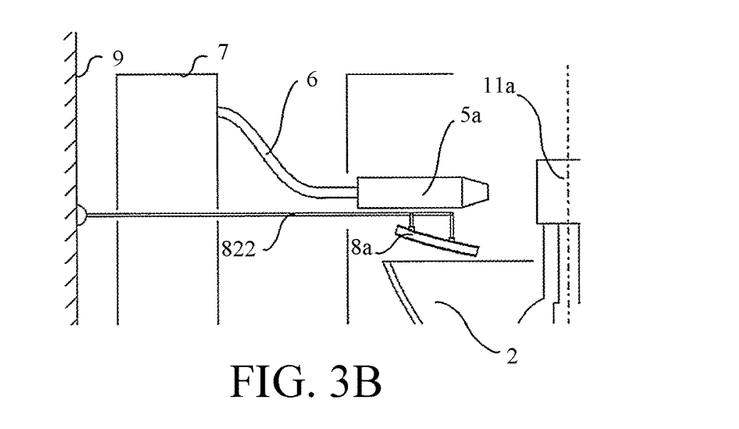
Figure 3C:
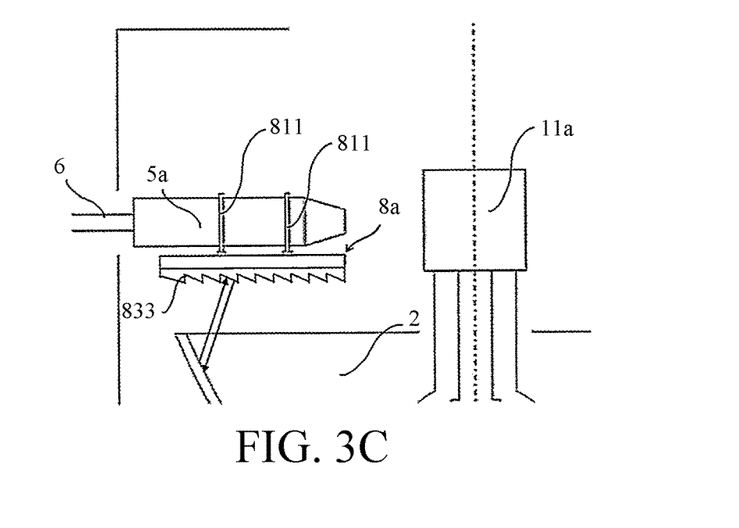

FIGS. 3A to 3C illustrate an arrangement of the nozzle Sa and reflective element 8a. The reflective element 8a may be supported by the nozzle 5a via holding members 811, as illustrated in FIG. 3A, or may be supported by a holding member 822 that is fastened to a structure 9 via the retaining members 811, as illustrated in FIG. 3B. The reflective element 8a corresponds to part of a sphere that has a center at the second focal point 22 on which light from condenser mirror 2 is condensed. The reflective element 8a is a mirror in this embodiment as illustrated in FIGS. 3A and 3B, and has a mirror bottom surface 813 as a reflective surface. The mirror bottom surface 813 may be used as a transmission surface, and the mirror top surface 814 may be used as a reflective surface.

The reflective element 8a may also be a Fresnel mirror 833 having a discontinuous spherical surface, as illustrated in FIG. 3C. The reflective element 8a may have retroreflective performance that reflects the light from the condenser mirror 2 toward the condenser mirror 2.

Figure 4A:
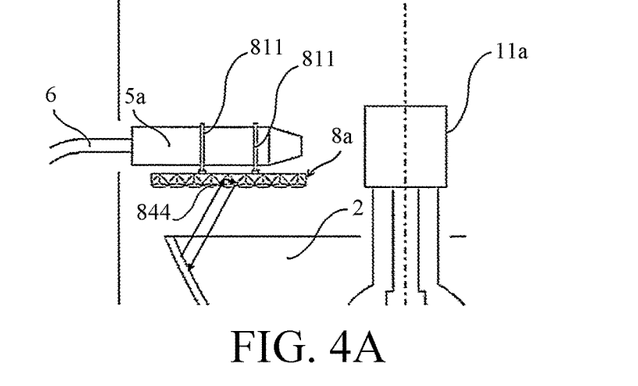
FIGS. 4A to 4C illustrate the reflective element with retroreflective performance according to the first embodiment.
Figure 4B:
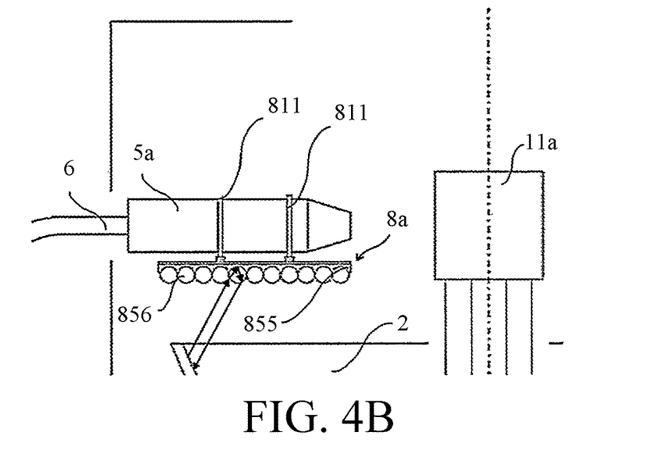
Figure 4C:
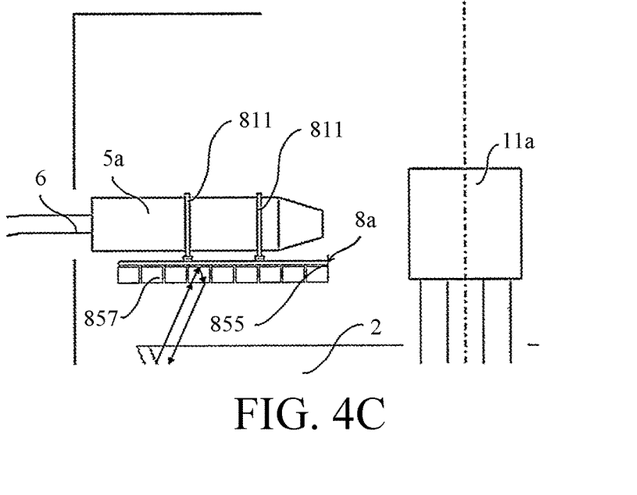

FIGS. 4A to 4C illustrate the reflective element 8a having the retroreflective performance. The reflective element 8a may include at least one corner cube 844 that has a reflective surface that reflects the light from condenser mirror 2 toward condenser mirror 2, as illustrated in FIG. 4A. In FIG. 4A, a plurality of corner cubes 844 are disposed on a plane. The light reflected by the condenser mirror 2 is reflected by the corner cube 844 having the retroreflection performance and returns to the condenser mirror 2.

The reflective element 8a may include a reflective member 855 and at least one spherical lens 856, as illustrated in FIG. 4B. In FIG. 4B, a plurality of spherical lenses 856 are disposed on a plane. The light reflected by the condenser mirror 2 is reflected by the reflective member 855 and the spherical lenses 856 and returns to the condenser mirror 2.

The reflective element 8a may include the reflective member 855 and at least one gradient index lens 857, as illustrated in FIG. 4C. In FIG. 4C, a plurality of gradient index lenses 857 are disposed on a plane. The light reflected by the condenser mirror 2 is reflected by the reflective member 855 and the gradient index lenses 857 and returns to the condenser mirror 2.

Since the light reflected by the reflective element 8a having the retroreflective performance always returns to the original optical path, the positional adjustment of the reflective element 8a and another adjustment become easy, and no mechanism is required for optical axis adjustment. In a case where the reflective element 8a is the Fresnel mirror or has retroreflective performance, the reflective element 8a in the vertical direction can be made thin and it becomes easy to arrange the reflective element 8a in a limited space.

Figure 5:
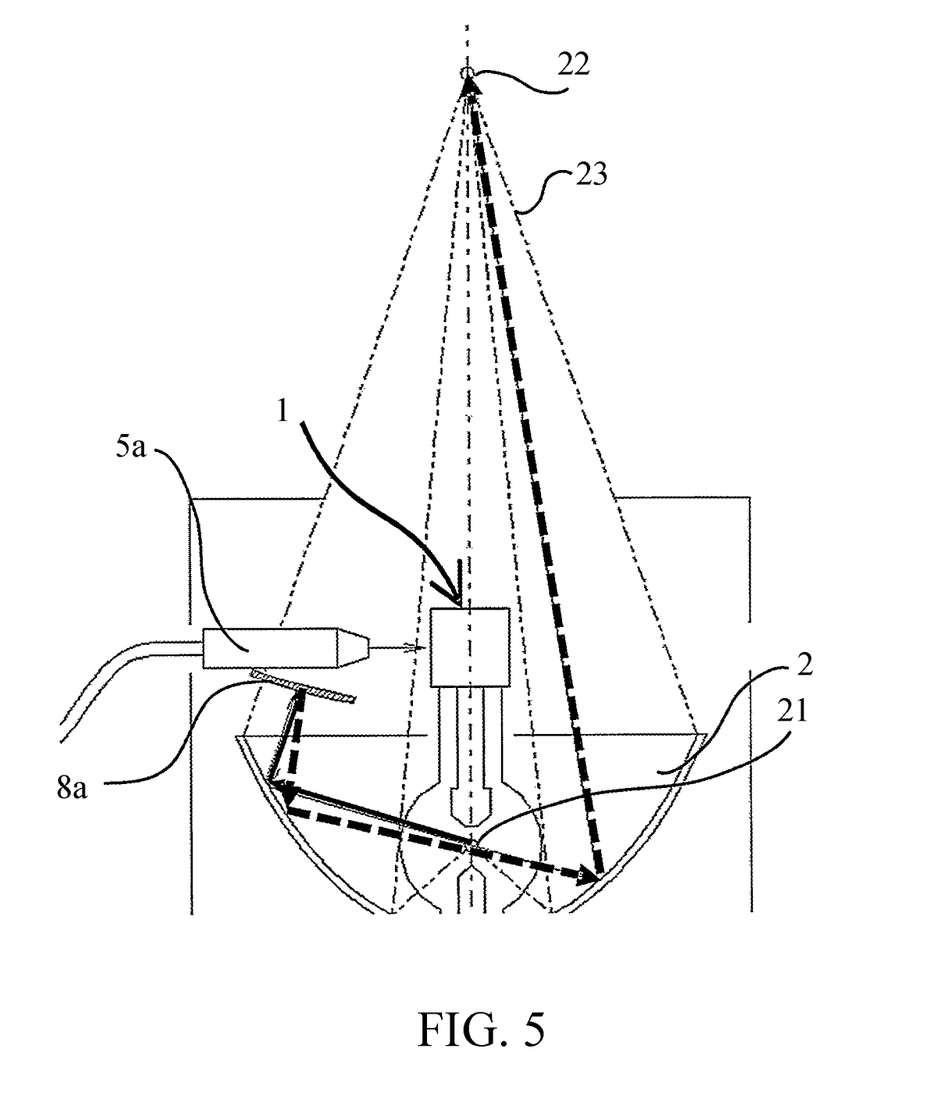
FIG. 5 explains an effect of the configuration according to the first embodiment.

FIG. 5 explains the effect of the configuration according to this embodiment. This embodiment provides the reflective element 8a, and enables the light that has conventionally been shielded by the nozzle 5a to be reflected by the condenser mirror 2, to pass through the first focal point 21, to be reflected by the condenser mirror 2, and to be condensed on the second focal point 22. Thereby, illumination reduction at the second focal point 22 can be suppressed.

Second Embodiment

Figure 6:
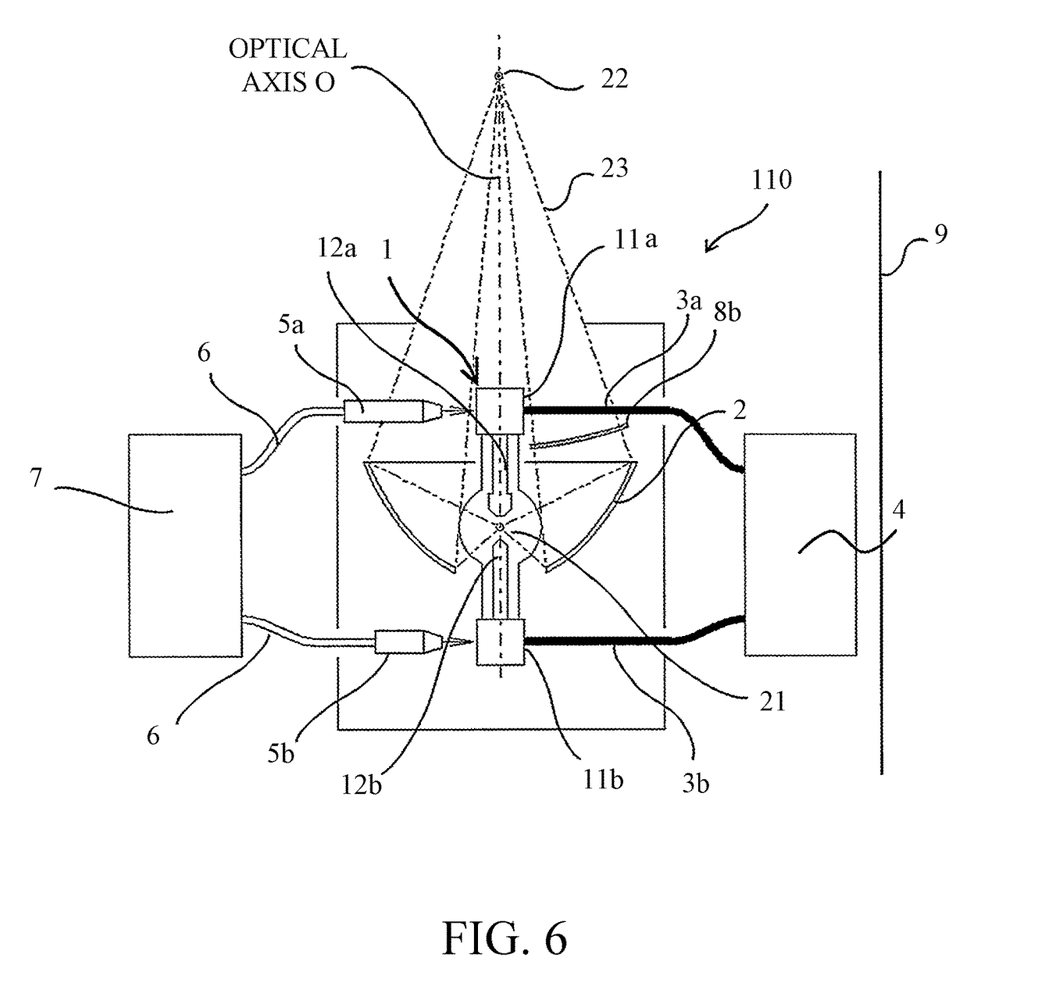
FIG. 6 is a configuration diagram of a lamp irradiating apparatus according to a second embodiment.

FIG. 6 is a configuration diagram of a lamp irradiating apparatus 110 according to this embodiment. The lamp irradiating apparatus 110 according to this embodiment is different from that of the first embodiment in the arrangement of the reflective elements, and the rest of the configuration is similar to that of the first embodiment.

The lead wire 3a connected to the lamp 1 is disposed at a position that shields part of the effective light beam 23 (light from the condenser mirror 2). A reflective element 8b is disposed between the condenser mirror 2 and the lead wire 3a (light shielding unit). The reflective element 8b may be supported by the lead wire 3a or may be supported by the holding member fastened to structure 9. The reflective element 8b corresponds to part of the sphere that has a center at the second focal point 22. The reflective element 8b may have the retroreflective performance that reflects the light from the condenser mirror 2 toward the condenser mirror 2.

This embodiment provides the reflective element 8b, and enables the light that has conventionally been shielded by the lead wire 3a to be reflected by the condenser mirror 2, to pass through the first focal point 21, to be reflected by the condenser mirror 2, and to be condensed on the second focal point 22. Thereby, illumination reduction at the second focal point 22 can be suppressed.

Third Embodiment

Figure 7:
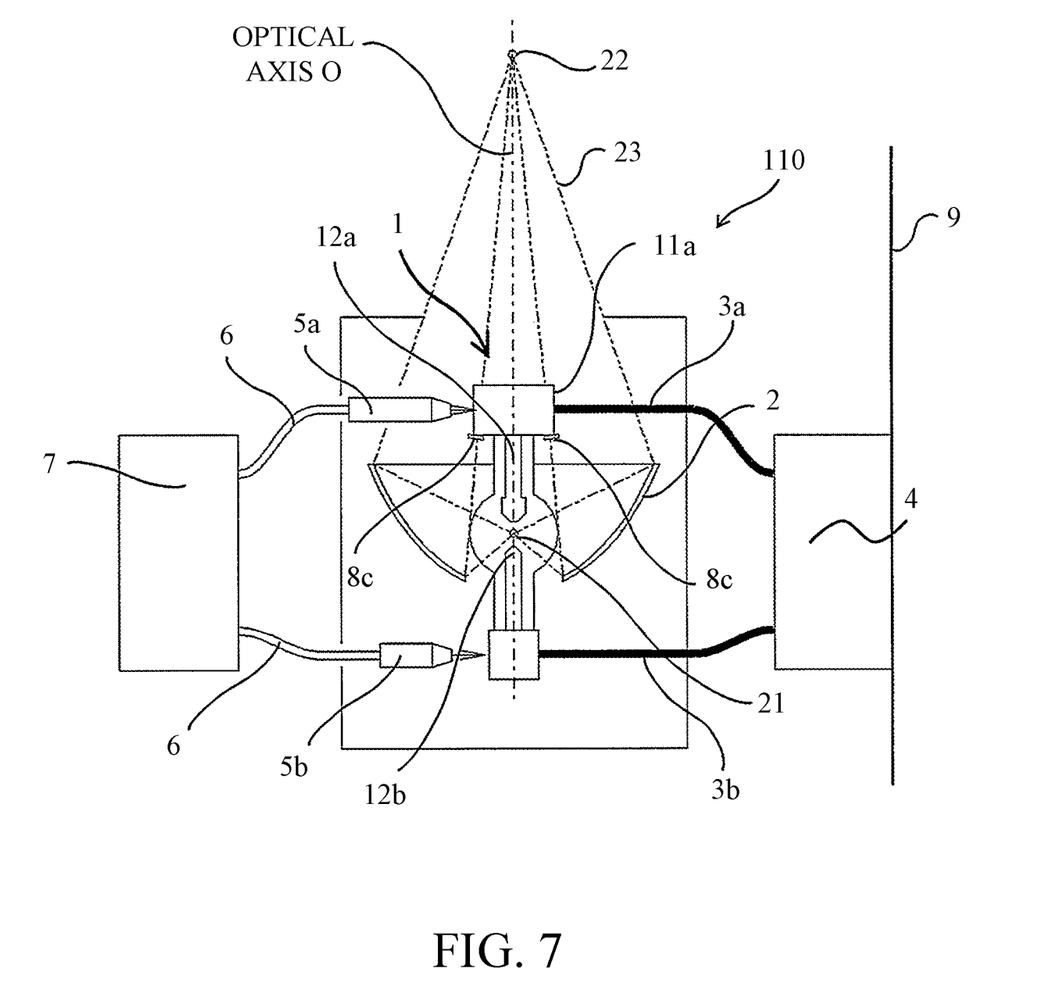
FIG. 7 is a configuration diagram of a lamp irradiating apparatus according to a third embodiment.

FIG. 7 is a configuration diagram of a lamp irradiating apparatus 110 according to this embodiment. The lamp irradiating apparatus 110 according to this embodiment is different from that of the first embodiment in the arrangement of the reflective element, and the rest of the configuration is similar to that of the first embodiment.

The anode-side base 11a of the lamp 1 is disposed at a position that shields part of the effective light beam 23 (light from the condenser mirror 2). A reflective element 8c is disposed between the condenser mirror 2 and the anode-side base 11a (light shielding unit). The reflective element 8c may be integrated with the anode-side base 11a. The reflective element 8c corresponds to part of a sphere that has a center at the second focal point 22. The reflective element 8c may have the retroreflective performance that reflects the light from the condenser mirror 2 toward the condenser mirror 2.

This embodiment provides the reflective element 8c, and enables the light that has conventionally been shielded by the anode-side base 11a to be reflected by the condenser mirror 2, to pass through the first focal point 21, to be reflected by the condenser mirror 2, and to be condensed on the second focal point 22. Thereby, illumination reduction at the second focal point 22 can be suppressed.

Fourth Embodiment

Figure 8:
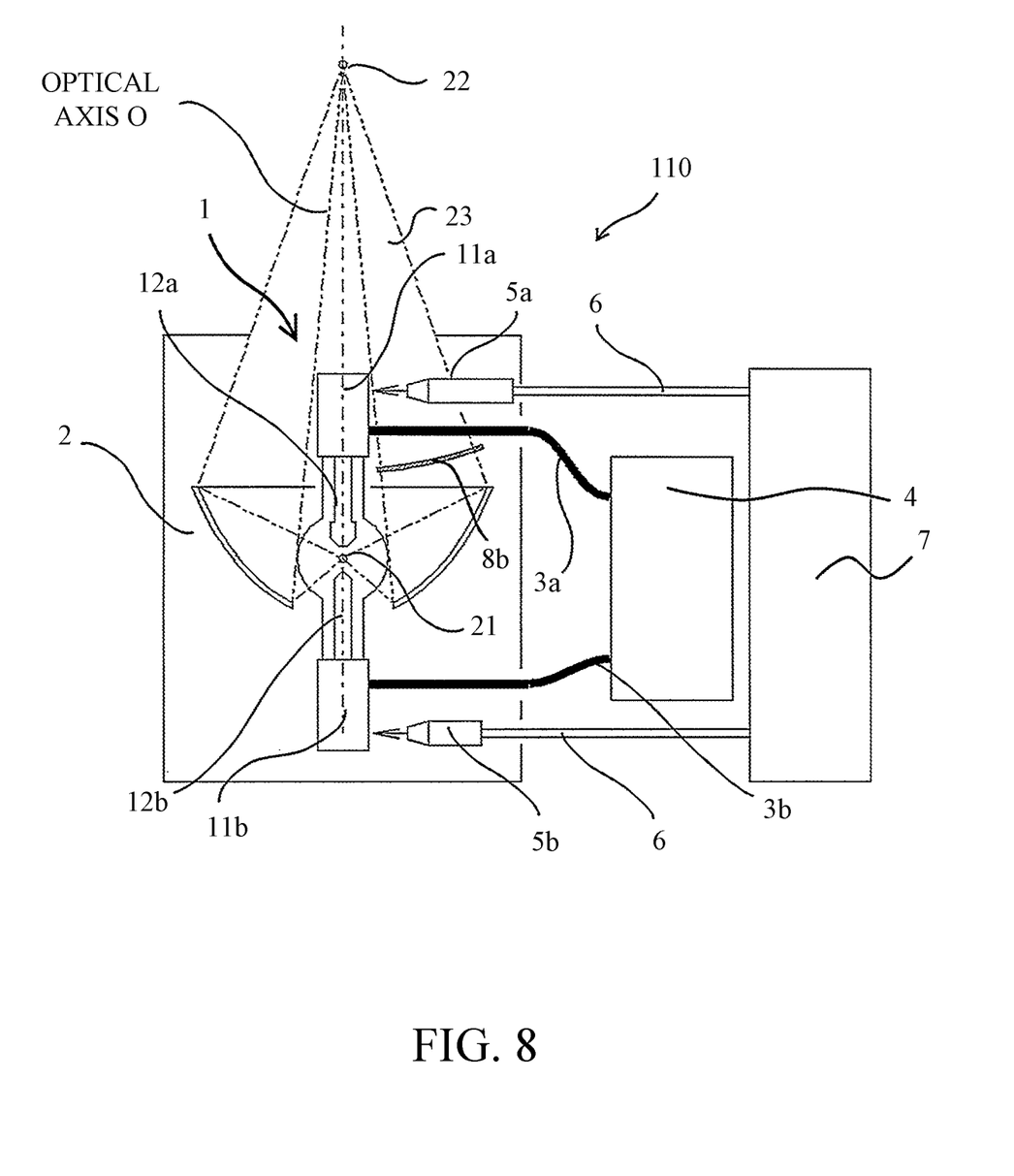
FIG. 8 is a configuration diagram of a lamp irradiating apparatus according to a fourth embodiment.

FIG. 8 is a configuration diagram of a lamp irradiating apparatus 110 according to this embodiment. The lamp irradiating apparatus 110 according to this embodiment is different from that of the second embodiment in the arrangement of the nozzles 5a and 5b, the pipes 6, and the air supply apparatus 7, and the rest of the configuration is similar to that of the second embodiment.

The lead wire 3a and the nozzle 5a are disposed so as to overlap each other, when viewed from the second focal point 22 (the side where the light from the lamp 1 is reflected by the condenser mirror 2). Of the lead wire 3a and the nozzle 5a, either may be located higher or lower. That is, the lead wire 3a is disposed on the side closer to the condenser mirror 2 in this embodiment, but the nozzle 5a may be disposed on the side closer to the condenser mirror 2. The reflective element 8b is disposed on the bottom side of the lead wire 3a or the nozzle 5a. The reflective element 8b may be supported by the lead wire 3a or the nozzle 5a, or may be supported by the holding member fastened to the structure 9.

This embodiment provides the reflective element 8b, and enables the light that has conventionally been shielded by the lead wire 3a and the nozzle 5a to be reflected by the condenser mirror 2, to pass through the first focal point 21, to be reflected by the condenser mirror 2, and to be condensed on the second focal point 22. Thereby, illumination reduction at the second focal point 22 can be suppressed.

In this embodiment, the lead wire 3a and the nozzle 5a are disposed so as to overlap each other, when viewed from the second focal point 22. Therefore, this embodiment reduces the number of elements that shield light and can combine the reflective elements. That is, the configuration can be made simple.

Embodiment of Lithography Apparatus

A lithography apparatus according to this embodiment of the disclosure will be described. In this embodiment, an exposure apparatus that exposes a substrate to form a pattern on the substrate will be described as an example of the lithography apparatus, but the lithography apparatus is not limited to this embodiment. For example, the disclosure is applicable to an imprint apparatus that forms a pattern of an imprint material onto a substrate using a mold, or a lithography apparatus such as a drawing apparatus that irradiates a substrate with a charged particle beam to form a pattern on the substrate.

Figure 9:
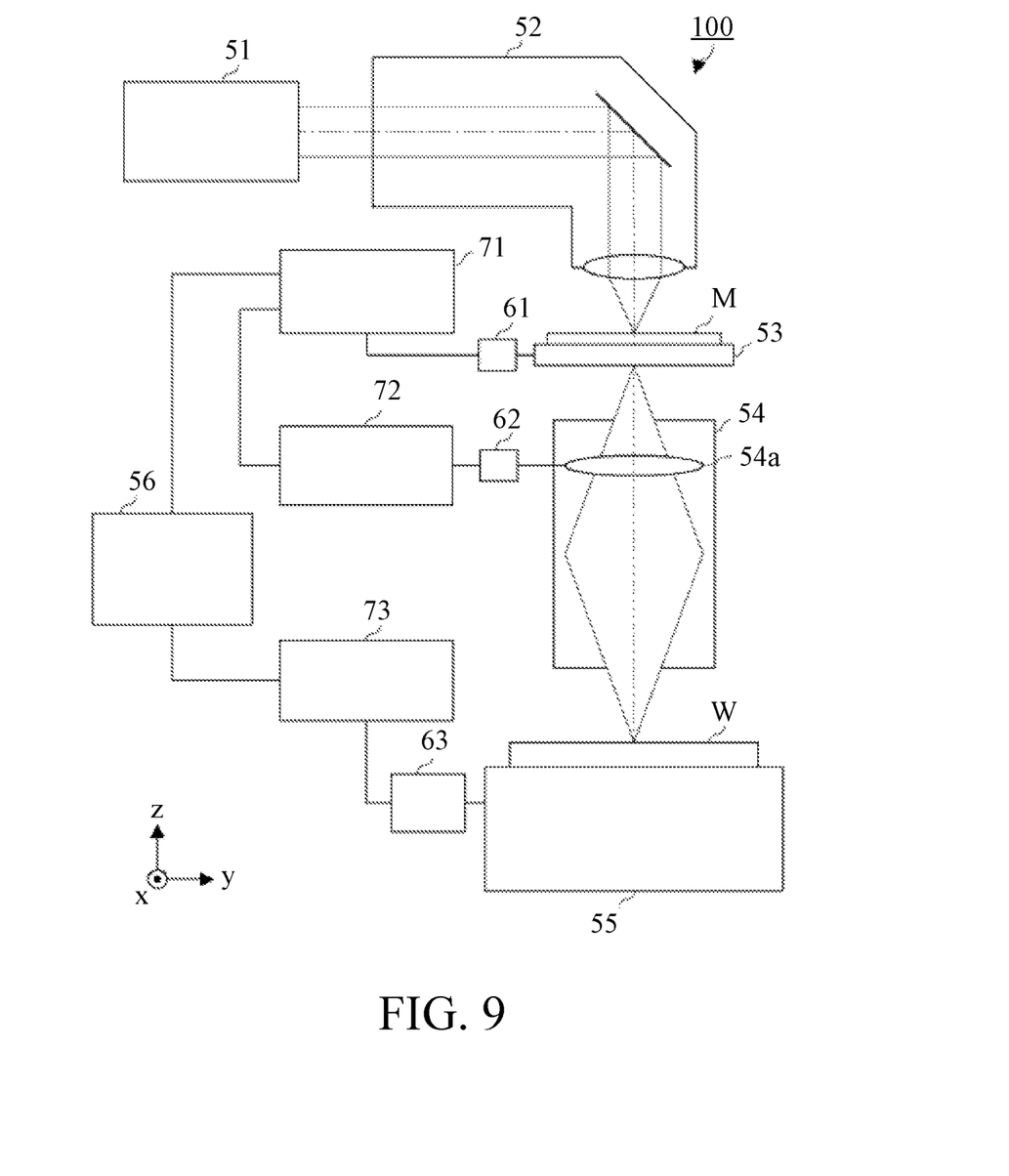
FIG. 9 is a configuration diagram of an exposure apparatus according to an embodiment of a lithographic apparatus.

FIG. 9 illustrates a configuration of an exposure apparatus 100 according to this embodiment. The exposure apparatus 100 is an exposure apparatus that exposes a substrate W by projecting an image of a pattern of a mask M onto the substrate W via a projection optical system 54. Here, a direction parallel to an optical axis of the projection optical system 54 is set to a Z-axis direction, and two directions orthogonal to each other in a plane orthogonal to the Z-axis direction are set to an X-axis direction and a Y-axis direction. In addition, OX, OY, and OZ are set to rotational directions about the X-axis, the Y-axis, and the Z-axis, respectively.

The exposure apparatus 100 includes a light source apparatus 51, an illumination optical system 52, a mask stage 53, the projection optical system 54, a substrate stage 55, and a main control unit 56. The exposure apparatus 100 further includes a first driving unit 61 that drives the mask stage 53, a second driving unit 62 that drives the optical element (lens) 54a of the projection optical system 54, and a third driving unit 63 that drives the substrate stage 55. The first driving unit 61, the second driving unit 62, and the third driving unit 63 are mechanisms that perform at least part of a process of forming a pattern on the substrate W and are controlled by a mask stage control unit 71, a projection control unit 72, and a substrate stage control unit 73, respectively. The main control unit 56 has, for example, a CPU (processing unit) and a memory (storage device), and controls the entire exposure apparatus 100 (each component of the exposure apparatus 100) by controlling the mask stage control unit 71, the projection control unit 72, and the substrate stage control unit 73.

The light source apparatus 51 emits exposure light. The illumination optical system 52 illuminates the mask M using the light emitted from the light source apparatus 51. The mask stage 53 holds the mask M, and is movable within the plane orthogonal to the optical axis of the projection optical system 54, that is, within the XY plane, for example, by the first driving unit 61. The projection optical system 54 projects an image of a pattern of the mask M illuminated by the illumination optical system 52 onto the substrate. The substrate stage 55 can hold the substrate W, and is movable within the XY plane and rotatable in the rotation direction OZ by the third driving unit 63.

Embodiment of Article Manufacturing Method

An article manufacturing method according to the embodiment of the disclosure is suitable for manufacturing an article, such as a microdevice (e.g., semiconductor device), an element having a fine structure, and a flat panel display. The article manufacturing method according to this embodiment includes the steps of forming a pattern on a substrate using the lithography apparatus described above and manufacturing an article from the substrate processed by the above step. This manufacturing method can include well-known steps (such as exposure, oxidation, film formation, vapor deposition, doping, planarization, etching, resist stripping, dicing, bonding, and packaging). The article manufacturing method according to this embodiment is more advantageous in at least one of article performance, quality, productivity, and production cost than the conventional methods.

Each of the above embodiments can provide a light source apparatus that can suppress illuminance reduction of light.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2021-197806, filed on Dec. 6, 2021, which is hereby incorporated by reference herein in its entirety.

What is claimed is:

1. A light source apparatus configured to emit light, the light source apparatus comprising:
   a condenser unit configured to reflect light from a light source and to condense the light on a condensing point;
   a light shielding unit disposed on an optical path of the light from the condenser unit; and
   a reflector unit disposed between the condenser unit and the light shielding unit and configured to reflect the light from the condenser unit,
   wherein the reflector unit is disposed so that reflected light is condensed by the condenser unit toward the condensing point.

2. The light source apparatus according to claim 1, further comprising a light source.

3. The light source apparatus according to claim 2, wherein the light source includes a lamp that includes a base unit.

4. The light source apparatus according to claim 3, wherein the lamp includes a mercury lamp.

5. The light source apparatus according to claim 3, wherein
   the light shielding unit includes the base unit, and
   the reflector unit is disposed between the condenser unit and the base unit.

6. The light source apparatus according to claim 3, further comprising a lead wire connected to the base unit,
   wherein
   the light shielding unit includes the lead wire, and
   the reflector unit is disposed between the condenser unit and the lead wire.

7. The light source apparatus according to claim 3, further comprising a nozzle configured to blow gas for cooling the base unit,
   wherein
   the light shielding unit includes the nozzle, and
   the reflector unit is disposed between the condenser unit and the nozzle.

8. The light source apparatus according to claim 3, further comprising:
   a lead wire connected to the base unit; and
   a nozzle configured to blow gas to cool the base unit,
   wherein
   the light shielding unit includes the lead wire and the nozzle, and
   the lead wire and the nozzle are disposed so as to overlap each other, when viewed from a side where the light from the light source is reflected by the condenser unit.

9. The light source apparatus according to claim 1, wherein the reflector unit corresponds to part of a sphere having a center at the condensing point.

10. The light source apparatus according to claim 1, wherein the reflector unit includes a Fresnel mirror.

11. The light source apparatus according to claim 1, wherein the reflector unit has retroreflection performance of reflecting the light from the condenser unit toward the condensing point.

12. The light source apparatus according to claim 11, wherein the reflector unit includes at least one corner cube having a reflective surface that reflects the light from the condenser unit toward the condenser unit.

13. The light source apparatus according to claim 11, wherein the reflector unit includes a reflective member and at least one spherical lens.

14. The light source apparatus according to claim 11, wherein the reflector unit includes a reflective member and at least one gradient index lens.

15. A lithography apparatus configured to form a pattern on a substrate, the lithography apparatus comprising a light source apparatus,
   wherein the light source apparatus includes:
   a condenser unit configured to reflect light from a light source and to condense the light on a condensing point;
   a light shielding unit disposed on an optical path of the light from the condenser unit; and
   a reflector unit disposed between the condenser unit and the light shielding unit and configured to reflect the light from the condenser unit,
   wherein the reflector unit is disposed so that reflected light is condensed by the condenser unit toward the condensing point.

16. An article manufacturing method comprising the steps of:
   forming a pattern on a substrate using a lithography apparatus configured to form a pattern on the substrate, the lithography apparatus comprising a light source apparatus that includes a condenser unit configured to reflect light from a light source and to condense the light on a condensing point, a light shielding unit disposed on an optical path of the light from the condenser unit, and a reflector unit disposed between the condenser unit and the light shielding unit and configured to reflect the light from the condenser unit, wherein the reflector unit is disposed so that reflected light is condensed by the condenser unit toward the condensing point; and
   manufacturing an article from the substrate on which the pattern has been formed.

* * * * *